United States Patent
Nakanishi et al.

[11] Patent Number: 5,832,373
[45] Date of Patent: Nov. 3, 1998

[54] OUTPUT POWER CONTROL DEVICE

[75] Inventors: Eiichi Nakanishi; Tetsuo Onodera, both of Tokyo, Japan

[73] Assignee: Oki Electric Industry Co., Ltd., Tokyo, Japan

[21] Appl. No.: 750,268

[22] PCT Filed: Mar. 29, 1996

[86] PCT No.: PCT/JP96/00851

§ 371 Date: Dec. 3, 1996

§ 102(e) Date: Dec. 3, 1996

[87] PCT Pub. No.: WO96/31954

PCT Pub. Date: Oct. 10, 1996

[30] Foreign Application Priority Data

Apr. 3, 1995 [JP] Japan .................................... 7-077552

[51] Int. Cl.$^6$ ................................................ H04B 11/12
[52] U.S. Cl. ........................................... 455/126; 455/69
[58] Field of Search ........................... 455/69, 115, 126, 455/127, 522, 278, 279

[56] References Cited

U.S. PATENT DOCUMENTS

| | | | |
|---|---|---|---|
| 5,081,713 | 1/1992 | Miyazaki | 455/126 |
| 5,126,688 | 6/1992 | Nakanishi et al. | 455/126 |
| 5,144,258 | 9/1992 | Nakanishi et al. | 455/126 |
| 5,166,559 | 11/1992 | Ishihara | 330/289 |
| 5,212,815 | 5/1993 | Schumacher | 455/126 |
| 5,373,251 | 12/1994 | Kunimoto et al. | 330/279 |
| 5,376,895 | 12/1994 | Aihara | 455/126 |
| 5,390,365 | 2/1995 | Enoki et al. | 455/553 |
| 5,561,395 | 10/1996 | Melton et al. | 330/279 |
| 5,564,087 | 10/1996 | Cygan et al. | 455/126 |
| 5,590,409 | 12/1996 | Sawanishi et al. | 455/69 |
| 5,678,209 | 10/1997 | Strakovsky | 455/115 |
| 5,689,815 | 11/1997 | Yamazaki et al. | 455/69 |

FOREIGN PATENT DOCUMENTS

| | | |
|---|---|---|
| 3-108817 | 5/1991 | Japan . |
| 4-3625 | 1/1992 | Japan . |
| 4-140931 | 5/1992 | Japan . |

*Primary Examiner*—Nguyen Vo
*Assistant Examiner*—Makoto Aoki
*Attorney, Agent, or Firm*—Wenderoth, Lind & Ponack, L.L.P.

[57] ABSTRACT

An output power control device is provided with an isolator, to which a transmission signal, that has been power amplified by a power amplifier, is input. The transmission signal is input via a transmission line connected to an output side of the power amplifier. The isolator only passes a progressive wave component of the transmission signal. The output power control device also includes a detection circuit for forming an actual output power detection signal by extracting part of an output power from a point of input of the isolator. Further, a reactance adjusting element connected to the point of input of the isolator cancels a parasitic reactance associated with the extracting section of the detection circuit.

4 Claims, 13 Drawing Sheets

OUTPUT POWER CONTROL DEVICE

TECHNICAL FIELD

The present invention relates to an output power control device for a radio device, for changing a target transmission output power gradually or continuously, for example, an output power control device mounted in a mobile terminal of a car phone system, a mobile phone system, etc.

BACKGROUND ART

Generally, in mobile communication systems, such as car phones etc., in order to limit power consumption or reduce interference to other mobile terminals, the output power level of a mobile terminal is subjected to output power control so as to change either in multiple stages or continuously depending on a base station instruction. For example, a mobile terminal of a car phone system of the North American Analog Cellular System controls the output power in six stages (PL2–PL7), with +28 dBm as the largest output.

FIG. 2 is a block diagram showing the basic construction of a conventional output power control device for carrying out such a power control operation.

In FIG. 2, a carrier wave signal generated by an oscillator 1 is input to a power amplifier 3 by being converted to a transmission signal through various processing circuits, such as a driver amp 2. A transmission signal that has been power amplified by this power amplifier 3 is input to an antenna resonator 8 through a coupling transmission path (directional coupler) 4 etc., and after undesired waves have been eliminated by the antenna resonator 8, the signal is radiated into space from an antenna 9 used for both transmission and reception (hereafter simply called antenna).

A received signal, which is converted to an electrical signal as a result of the antenna 9 capturing a radio wave has undesired frequency bands eliminated by the antenna resonator 8. The received signal is then pre-amplified by the preamp 10 and input to a received signal processing system. A receive signal from such a base station includes transmission output power level instruction information.

The coupling transmission path 4 mentioned above is comprised of a main transmission line 4a, coupling transmission line 4b and termination resistance 4c. Only traveling waves from the transmission signal from the power amplifier 3 are input to a detection circuit 5 by being extracted from one end of the coupling transmission line 4b. In the detection circuit 5, this transmission signal is biased according to bias resistor 5a and rectified by being input to a detection diode 5c via coupling capacitor 5b. Thereafter, the signal is made into smooth d.c. using smoothing capacitor 5d and load resistor 5e to provide a detection power output (detection signal). This detection signal is input to a feedback control circuit 6 as a TSSI (Transmission Signal Strength Indication) signal corresponding to an actual output level radiated from the antenna 9.

The controller 7 supplies a control signal representing a specified output power level to a feedback control circuit 6, according to an instruction from a base station (not shown). As a result of this, the feedback control circuit 6 forms and outputs a feedback signal (hereafter called FB signal) for reducing the difference between an actual output level recognized from the TSSI signal and a target power level to be controlled. The FB signal is input to, for example, the Vcont input terminal of a power amplifier 3 whose output power level can be varied.

As described above, an output power level feedback loop is formed, and in this feedback loop, the controller 7 provides an output power target value to be controlled, and the output power level is controlled to become that target power level.

Further, there have recently been many cases where digital processing has also been applied to parts of output power control devices, as shown in FIG. 3. That is, the TSSI signal from the detection circuit 5 is converted to digital data by the A/D converter 11 and input to the controller 7. The FB signal data is formed by computation in the controller 7 which also provides the function of the feedback control circuit 6. This FB signal data is converted to an FB signal by the D/A converter 12 and is output. In this way, operations equivalent to the arithmetic and logic processing of the controller 7 (operations of the feedback control circuit 6) are realized by temporarily converting to a digital signal, without using an analog circuit such as an op-amp for comparison with the feedback control circuit 6. Here, the controller 7 controls that conversion operation by supplying control signals (such as clock signals) to the A/D converter 11 and D/A converter 12. If the A/D converter 11 has an 8 bit resolution in an input range of, for example, 0–5V, then it will have a detection resolution of approximately 0.019V (=5V/256). The output power (W) and the TSSI signal from the detection circuit 5 generally have a directly proportional relationship. On the other hand, the controlled output signal is generally controlled (changed) at logarithmic intervals. That is, in dBm units, the signal is controlled in 4 dB intervals. Accordingly, the TSSI signal level corresponding to each control level is also logarithmically changed.

However, in the conventional output power control device, there are the following problems.

First, there is the problem that temperature stability is low. This problem exists in both the output power control device shown in FIG. 2, and the output power control device shown in FIG. 3. For example, in systems such as cellular car phone systems, the range of the service area (namely, a cell) is made extremely small. In response to the formation of these micro cells, there is also a demand to carry out control so as to reduce the output power of the mobile terminal to much lower than before. For example, in a mobile terminal (class 3) of the North American digital cellular system, compared to the above mentioned Analog Cellular System (class 3), it is also necessary to control to an output level which is smaller by 3 steps, namely 12 dB. Accordingly, the TSSI signal corresponding to the output power must also have linearity and temperature stability in a 32 dB range. However, in a method which extracts the output power using a coupling transmission path 4 it is difficult to make the degree of coupling sufficient, which means that it is not possible to provide a detection voltage to bring about sufficient temperature stability. Further, even if the degree of coupling of the coupling transmission path 4 is improved, the loss is also increased, and so it is not possible to make the detection power sufficiently large. For example, in the case that the degree of coupling in a 80 MHz band is −16 dB, only a detection voltage of a 2V level can be provided when the output power is 1 W. As shown in FIG. 4, when 32 dB power control is considered, the detection voltage changes in the range from 2V to 50 mV and the fact that the detection characteristics fluctuate considerable according to temperature can not be avoided.

Second, in the device shown in FIG. 3, namely, a device that recognizes the TSSI signal using an A/D converter 11, there is a problem of detection resolution. For example, in the case where a TSSI signal of 50 mV, corresponding to the smallest output power level PL10, is AD converted, if the A/D converter having the above mentioned 8 bit, 19 mV resolution (quantization step) is used, a value in a 19 mV range about a 50 mV center and a value from 50 mV to 69 mV will be converted to the same digital data, which means it possesses a detection resolution of only (50+19)/50=1.38, namely about 4 dB. Accordingly, in the event that the FB signal is formed by processing TSSI data having this type of detection error (quantization error), the effect of the detection resolution of the A/D converter becomes large as the target output power becomes small, and desired control is not actually realized.

With both the first and second problems above, the effect is more striking as the target output power becomes small, and accordingly, if it is desired to perform output control across a wide power range, the problem becomes significant when the target output power level is small.

SUMMARY OF THE INVENTION

Therefore, the object of the present invention is to provide an output power control device having a wide temperature compensation range and which can carry out desired output power control.

A further object of the present invention is to provide an output power control device in which for the same target output power, a detection signal level is larger than that in the related art, and in which the detection signal level is raised to such a level that it is unlikely to be subject to the influence of temperature variation, even when the target output power is comparatively small.

One aspect of the invention is directed to an output power control device for changing a transmission output power gradually or continuously, and having a feedback control system, having such a composition that an isolator is provided subsequent to a transmission line connected to the output side of a power amplifier. A detection signal of an actual output power is formed by extracting a portion of an output power from a point of input of this isolator using a detection circuit. A reactance adjusting element for canceling a parasitic reactance associated with the extracting section of the detection circuit is connected to a point of input of the isolator.

Another aspect of the invention is directed to an output power control device for changing a transmission output power gradually or continuously, and having a feedback control system, comprising an open control system for open controlling the output power, control system switch means for causing a feedback control system to function when a target output power level is larger that a previously determined specified value, while causing an open control system to function when the target output power level is smaller than a previously determined specified value, and temperature compensation means for compensating for temperature variations of the output power at least when the open control system is operating.

BEST MODE FOR PRACTICING THE INVENTION

Figure 1:
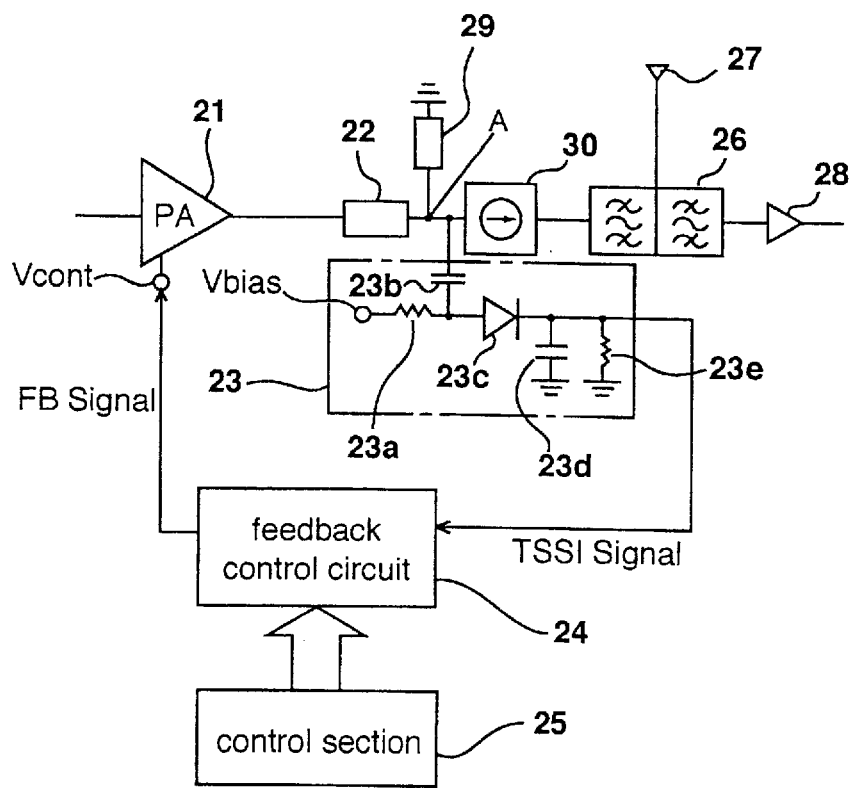
FIG. 1 is a block diagram showing the configuration of a first embodiment.

A first embodiment of an output power control device according to the present invention will now be described below with reference to the drawings. Here, FIG. 1 is a block diagram showing the configuration of a first embodiment. This first embodiment is aimed at an output power control device installed in a mobile terminal.

In FIG. 1, the power amplifier 21 power amplifies a transmission signal and inputs the amplified signal to an isolator 30 via a transmission line 22. The isolator 30 prevents a reflected wave component from returning to the power amplifier side, and inputs the power amplified transmission signal to an antenna coupler 26. The antenna coupler 26 eliminates undesired frequency bands from a receive signal converted to an electrical signal as a result of the antenna 27 capturing a radio wave, and then inputs the receive signal to a receive signal processing system via a preamp 28 for pre amplification. A receive signal from such a base station contains output power level instruction information. The end of the transmission line 22 toward the isolator 30 is connected to a detection circuit 23 comprising bias resistor 23a, coupling capacitor 23b, detection diode 23c, smoothing capacitor 23d and load resistor 23e. In the detection circuit 23, the coupling capacitor extracts an a.c. component of the transmission signal at the end of the transmission line 22 toward the isolator 30. The bias resistor 23a is provided to superimpose a bias voltage Vbias on this a.c. component, and the biased a.c. signal (directly incorporating amplitude information of the power amplified transmission signal) is applied to the anode terminal of the detection diode 23c. The detection diode 23c is for rectifying the biased a.c. signal, and the smoothing capacitor 23d. The load resistor 23e are connected to the cathode terminal. The smoothing capacitor 23d and load resistor 23e are for smoothing the rectified signal and making it into a d.c. voltage, and this d.c. voltage signal is input to the feedback control circuit 24 as a TSSI signal. The controller 25 supplies a control signal representing a specified output power level (target output power level) to the feedback control circuit 24. The feedback control circuit 24 forms an FB signal for canceling out a difference between an actual output power level recognized from the TSSI signal and a target output level instructed by the control signal, and applies the FB signal to a Vcont input terminal which can vary the output power level of the power amplifier 21. If the feedback control circuit 24 is provided with a comparator for comparing the TSSI signal level and a reference voltage level, it is possible for the control signal from the controller 25 to the feedback control circuit 24 to be the reference voltage input to this comparator, and in the event that a D/A converter is provided at the input terminal of the comparator, this reference voltage can be digital data output from the D/A converter.

In addition to the above construction, in the first embodiment, a reactance adjusting element 29 is connected to an end of the transmission line 22 at the isolator 30 side. The reactance adjusting element 29 is provided to cancel out the equivalent reactance component of the detection circuit 23. Considering the detection circuit from the point A at the end of the transmission line on the isolator 30 side, the reactance component has, for example, a capacitive reactance due to component attachment pads, leadout wires, etc. In order to cancel this parasitic reactance component, an impedance element is added as the reactance adjusting element 29, and the impedance viewing the detection circuit 23 from point A is sufficiently large compared to the impedance of the transmission line (50Ω).

The most important feature of the first embodiment is that this reactance adjusting element is provided, and the fact that the above mentioned isolator 30 is provided in order to supply directionality is also a feature. That is, the feature of the first embodiment is that from the basic route of the transmission signal arriving at the antenna 27, the construction for extracting output power level information is different from the related art.

In the following, the operation of the first embodiment will be described, and also, the functions and operations of the reactance adjusting element 29 and the isolator 30, etc. that comprise the characteristic construction of the first embodiment will be described together.

The basic operation of controlling the output power in the first embodiment is similar to that in the related art. That is, the power amplified transmission signal from the power amplifier 21 is irradiated into space by being supplied to the antenna 27 via the antenna coupler 26. Also, the output power level of the transmission signal is extracted by the detection circuit 23 as a TSSI signal, and is input to the feedback control circuit 24. In response to this TSSI signal and a control signal from the control section 25, the feedback control circuit 24 forms an FB signal for canceling out a difference between an actual output power level and a target output power level and applies the FB signal to the power control terminal Vcont of the power amplifier 21. As a result of this feedback loop, the actual output power level is made the same as that of a target output power level.

When there is an instruction to alter the target output power level from the base station, the instruction content of the control signal from the control section 25 is changed, but also at this time, the actual output power level is converged to a new target output power level using the above described operation of the feedback loop. With this convergence function the output power level is made stable using the above described operation of the feedback loop.

Figure 2:
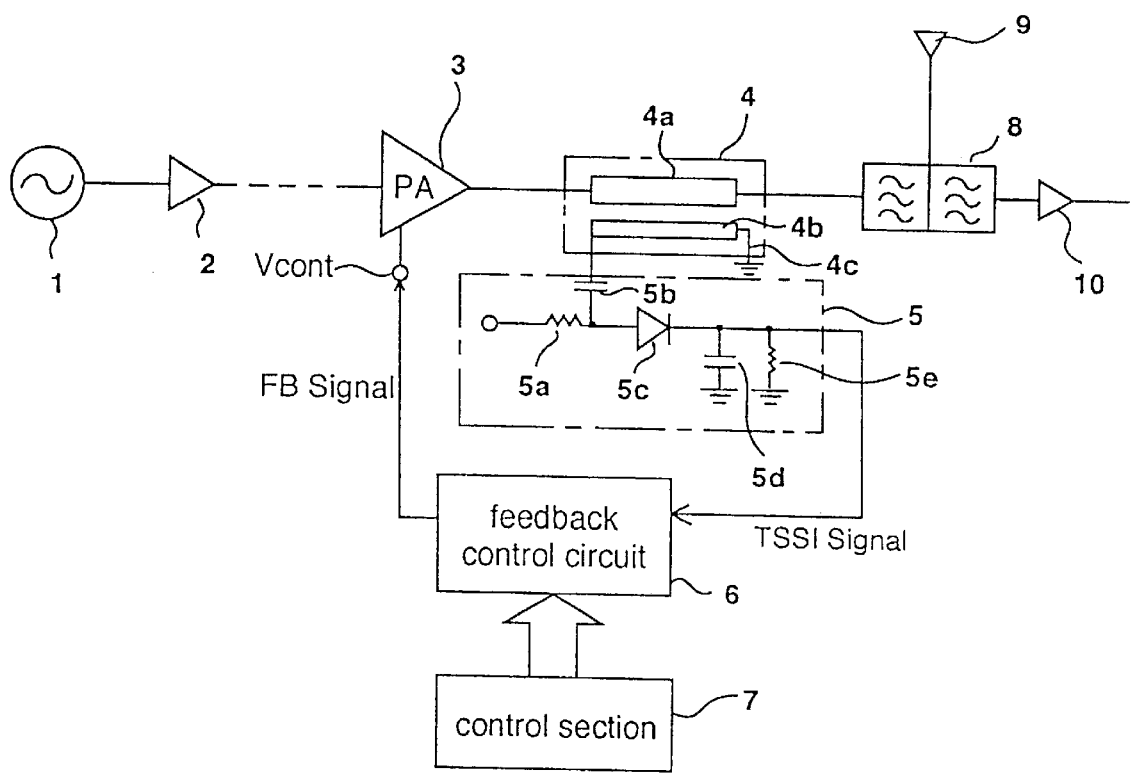
FIG. 2 is a block diagram showing a related art device.
Figure 3:
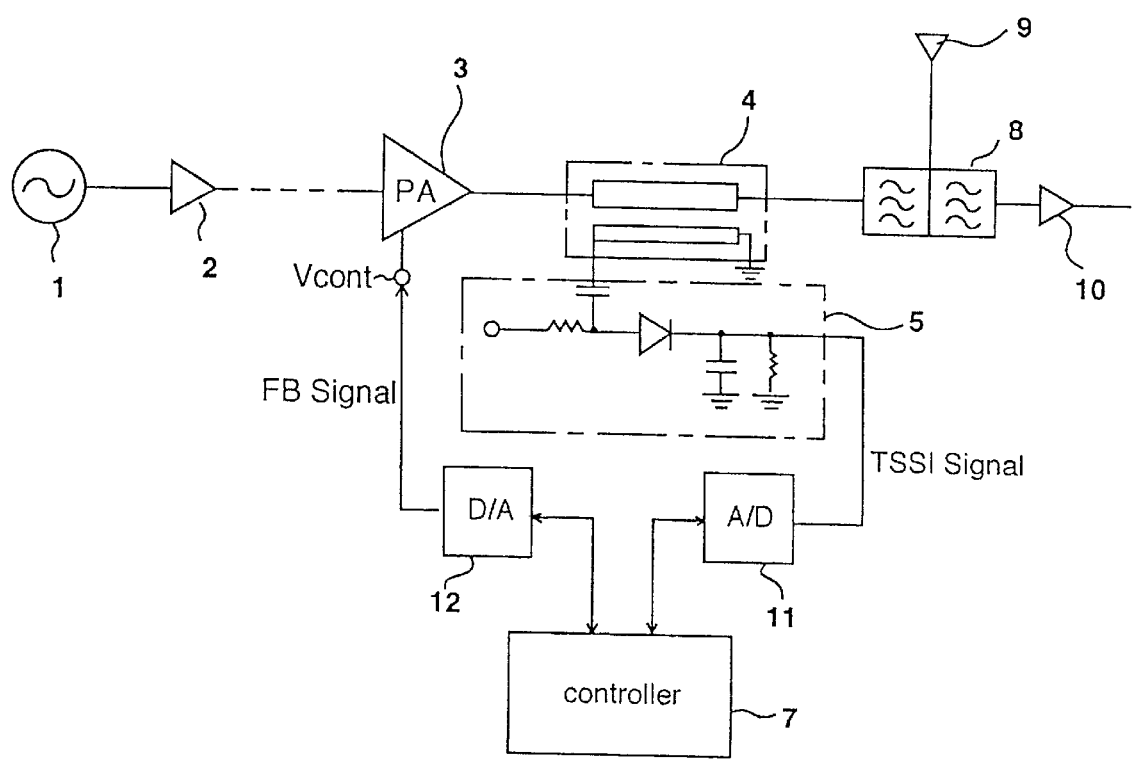
FIG. 3 is a block diagram showing a related art device.

As has been described above, the construction for extracting output power level information from the basic route of the transmission signal supplied to the antenna 27 from the power amplifier 21 is a feature of the first embodiment. That is, the first embodiment is characterized by the fact that the output power information is extracted, via coupling capacitor 23a, from the isolator 30 end of the transmission line 22 connecting to the reactance adjusting element 29. In the above mentioned related art device shown in FIG. 2 and FIG. 3, because this information is extracted by the coupling transmission path (directional coupler) 4, the degree of coupling is reduced from a tradeoff with the loss of a transmission signal progressing along the basic route, for example, to −13 dB. At this time, if the impedance of the coupling transmission path 4b of the coupling transmission path 4 is 50Ω, and the detection efficiency of the detection circuit 5 is 100%, the maximum detection voltage Vdet that can be obtained when 1 W is output is 2.2V. That is, considering effective values, the power P is a product of the current I and voltage V, and moreover, the current I is the voltage V divided by resistance R, which means that the maximum detection voltage Vdet can be represented by $\sqrt{(2 \times P \times R)}$ ($\sqrt{2}$ is a peak factor for converting an effective value into a maximum value). Substituting with P=−13 dB, W=0.05 W and R=50Ω, it can be found that the maximum detection voltage Vdet that can be provided when 1 W is output is 2.2V.

On the other hand, in the first embodiment, the transmission signal (RF signal) from the basic route is extracted without using the coupling transmission line, so a power of 1W is directly applied. Also, in this first embodiment, by using the reactance adjusting element 29 the reactance component, taking into consideration the detection circuit 23, becomes 0. Accordingly, the impedance, taking into consideration the detection circuit 23, can be raised to a number of kΩ by using a reactance adjusting element 29 with a sufficiently high Q factor. As a result, if the impedance of the transmission line 22 is 50Ω and the maximum detection voltage is Vdet, $Vdet=\sqrt{(2 \times 1 \times 50)}=10V$ is obtained. Further, if the impedance, taking the detection circuit 23 into consideration, is 3 kΩ then $P=V^2/r=0.033$ W, and it is inevitable that the input power to the detection circuit 23 side suffers a loss of 0.14 dB for a 1 W output power.

Figure 4:
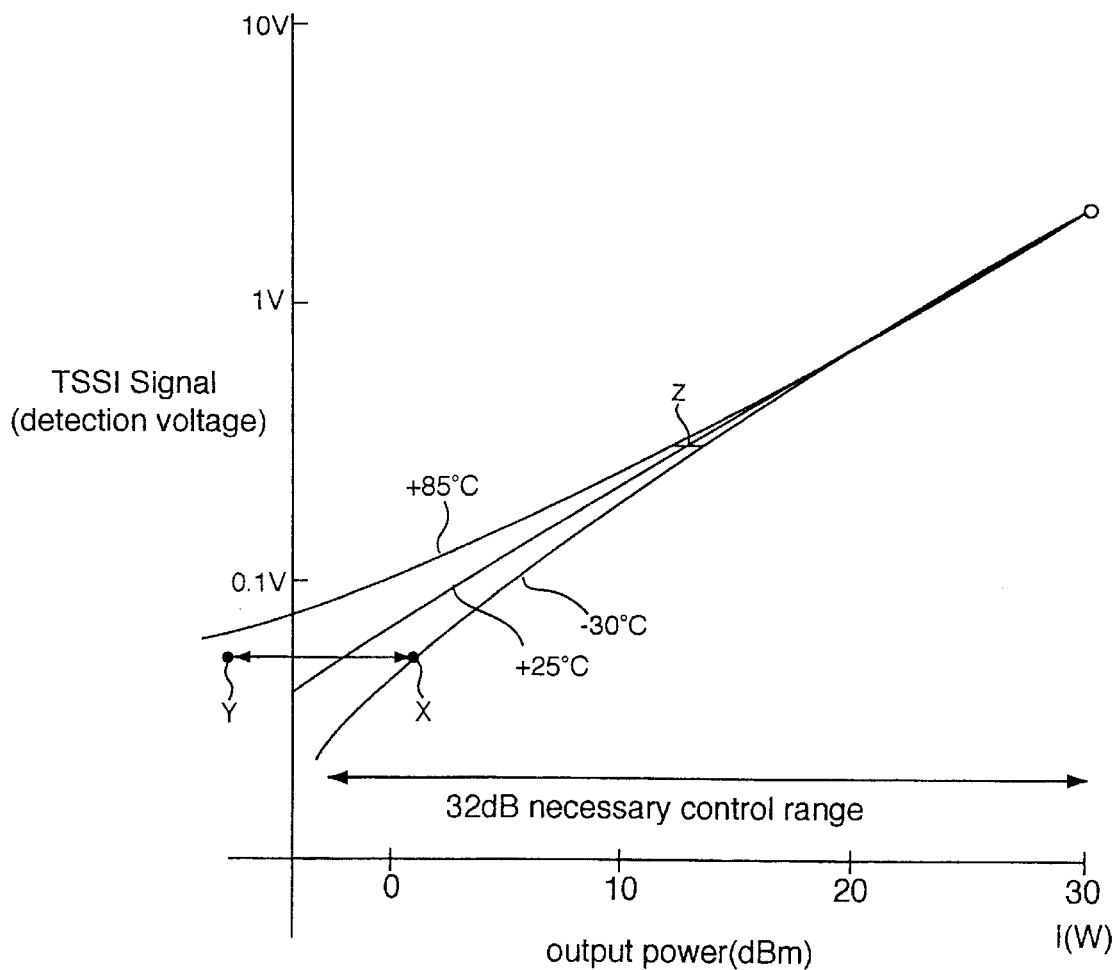
FIG. 4 is an explanatory diagram showing output power detection voltage of the related art.

In other words, in this first embodiment, by directly extracting the transmission signal from the end of the transmission line 22 it is possible to suppress the power loss of the detection circuit 23, regardless of the fact that an extremely large detection voltage is extracted. In this type of situation, for example, if an output power range of 32 dB is considered, the TSSI signal varies from a maximum of 10 V to a minimum of 250 mV, and the output level having the value of a point PL10, where the TSSI signal has the minimum power level of 250 mV, only varies 1 dB in a temperature range of −30° C.−+85° C. (see range Z in FIG. 4). That is, in this first embodiment, the level of temperature stability of the TSSI signal is improved and stabilized power control can be carried out. Another feature of the first embodiment is that the generation of standing waves due to the existence of reflected waves is reduced by using the isolator 30, and the frequency characteristic of the detection voltage is stabilized. That is, the reflectance preventing function of the conventionally used coupling transmission line (directional coupler) is substituted by the isolator 30, and by providing this isolator 30 the operational stability of the power amplifier 21 is raised. In order to raise the stabilization of the frequency characteristic of the detection voltage, the transmission signal (signal representing the output power) is extracted from the point of input of the isolator 30 via coupling capacitor 23b.

In the above described manner, according to the first embodiment: 1) the transmission signal to the detection circuit 23 can be extracted from a point of connection between the transmission line 22 following from the power amplifier 21 and the isolator 30; 2) parasitic reactance created by the extracting section of the detection circuit is cancelled by the reactance adjusting element 29; and 3) by applying the isolator 30 etc. in place of the directional coupler the following effects can be anticipated.

1-A sufficiently large detection voltage can be extracted, and a temperature stable detection voltage spanning a wide range of output power levels can be obtained, as a result of which stable output power control can be carried out regardless of temperature variation.

2-The temperature characteristic of the detection voltage can be stabilized by using the isolator 30, making it possible to carry out stable output power level control.

3-By using the isolator 30, distortion characteristic stabilization and operational stabilization of the power amplifier 21 can be expected.

Figure 5:
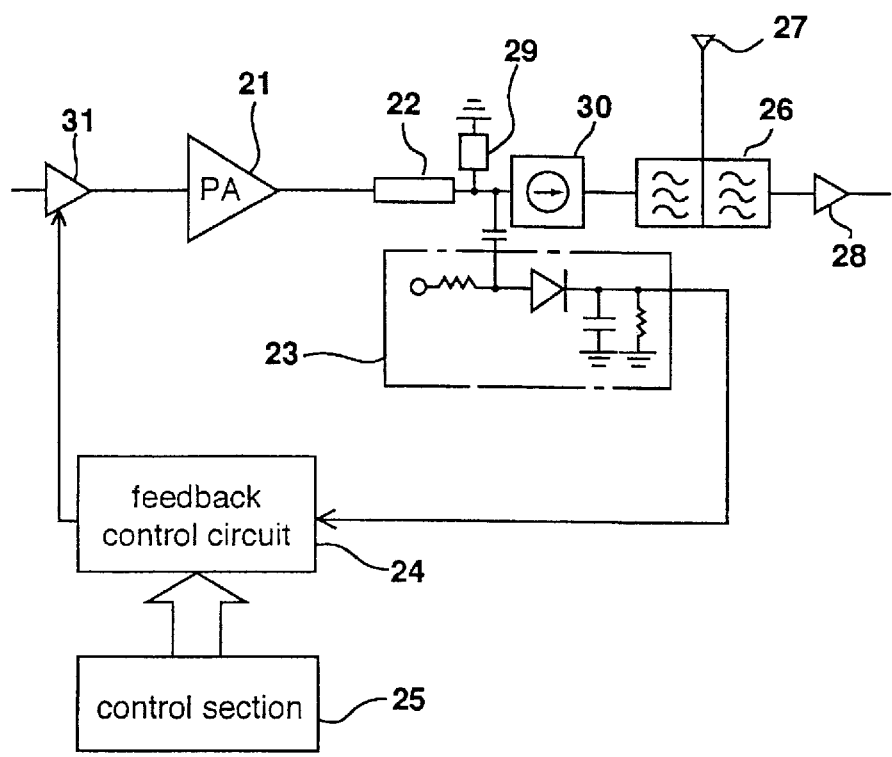
FIG. 5 is a block diagram showing the configuration of a second embodiment.

Next, a second embodiment of a output power control device of the present invention will be described with reference to FIG. 5. In the construction of FIG. 5, parts that are the same as in FIG. 1 have the same reference numerals.

The output power control device of the second embodiment is provided with a variable gain amplifier 31 (including an attenuator) at an input side of the power amplifier 21. An FB signal formed by the feedback control circuit 24 is applied to a control input terminal of the variable gain amplifier 31. All other parts are the same as the first embodiment. In the second embodiment, the method of extracting the signal for detecting the output power is also from the basic route of the transmission signal, similarly to the first embodiment, so the same effects as those in the first embodiment can be obtained. In addition to this, according to this second embodiment, the destination of the feedback of the FB signal is the variable gain amplifier 31 provided at the input side of the power amplifier 21, which means that compared to when it is fedback to the power amplifier 21 the distortion occurring when the power amplifier 21 is controlled by the FB signal can be avoided, and an output power control device having a much higher temperature stability can be anticipated.

Figure 6:
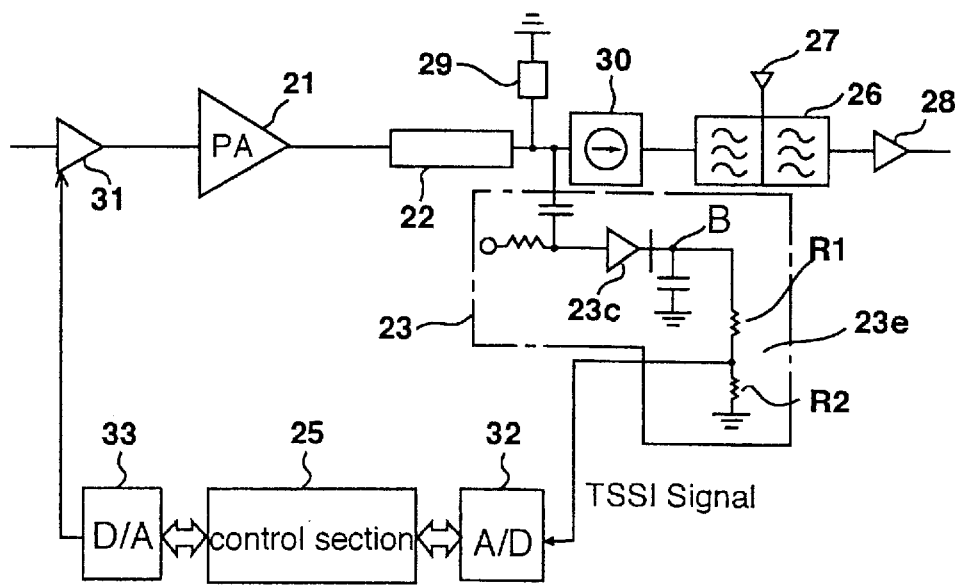
FIG. 6 is a block diagram showing the configuration of a third embodiment.

Next, a third embodiment of a output power control device of the present invention will be described with reference to FIG. 6. In the construction of FIG. 6, parts that are the same as those in FIG. 1 or FIG. 5 have the same reference numerals.

In this third embodiment, the feedback control circuit 24 forming the FB signal is consolidated into the control section 25. The TSSI signal from the detection circuit 23 is converted to a digital signal by an A/D converter 32 and input to the control section 25. An FB signal is then formed so as to eliminate a difference between an actual output power level and a target output power level, based on TSSI signal data input to the control section 25 and target output power level data for internal control. This FB signal data is converted to an FB signal (analog signal) by the D/A converter 33 and is input to the variable gain amplifier 31 (it can also be input to the power amplifier). Further, in the third embodiment two resistors R1 and R2 connected in series are used as the load resistor 23e, and the voltage at the point of connection of the resistors R1 and R2 is used as the TSSI signal. Other parts are the same as for the first and second embodiments.

As an example, a converter that converts 0–5V to 8 bits is applied as the A/D converter 32. As has also been described so far, in the signal extraction method used for detection in the related art shown in FIG. 3, in the North American digital cellular system (class 3), detection voltages are provided of 2.2V at the point of maximum output power level PL2 and of 50 mV at the point of minimum output power level PL10, and at this time, the conversion capacity of the A/D converter 32 is not sufficiently utilized. If the conversion capacity is sufficiently utilized, amplification must be carried out using an active element that is easily subject to the influence of temperature variation (for example, an op amp). On the other hand, similarly to the first and second embodiments, the signal for detection is also extracted from the basic transmission path of the transmission signal in the third embodiment, and as a result of this, at the point of maximum output power level PL2 of the North American digital cellular system (class 3), 10V is obtained as the voltage on the cathode of the detection diode 23c (point B), and at the point of minimum output power level PL10, 250 mV is obtained. Here, if the potential dividing ratio of the load resistor 23e comprising the two resistors R1 and R2 connected in series is made, for example, ½, the input voltage range to the A/D converter 32 can be made 125 mV–5V without using an active element, and the conversion capacity of the A/D converter 32 can be utilized effectively. Further, as described above, in the related art device shown in FIG. 3 having the A/D converter, the output power level is small, and the relative detection resolution after A/D conversion is low, and because a voltage range resulting in the identical digital data is a 0.019V range, the detection resolution at point PL10 is only about 4 dB, and fine power control can not be carried out. Contrary to this, in the third embodiment, because the TSSI signal level in the vicinity of point PL2 is 250 mV, the detection resolution is (250+19)/250=1.152, or 0.61 dB. That is, compared to the related art device, the power detection resolution is substantially improved, even at the time of minimum power control.

As has been described above, the method of extracting the signal for detecting the output power in the second embodiment is also from the basic route of the transmission signal, similarly to the first embodiment, so the same effects as those in the first embodiment can be obtained. Also, similarly to the second embodiment, the destination of the feedback of the FB signal is the variable gain amplifier 31 provided at the input side of the power amplifier 21, which means that compared to when it is fedback to the power amplifier 21 the distortion occurring when the power amplifier 21 is controlled by the FB signal can be avoided, and an output power control device having a much higher temperature stability can be expected. Further, according to the third embodiment, also when the FB signal is formed using a digital construction, the dynamic range of the A/D converter can be effectively utilized and a sufficient detection resolution can be obtained, while at the same time, the voltage input to the A/D converter can be realized with a simple resistor divider and not from an amplifier using active elements, and fine output power control with a high temperature stability can be achieved.

Figure 7:
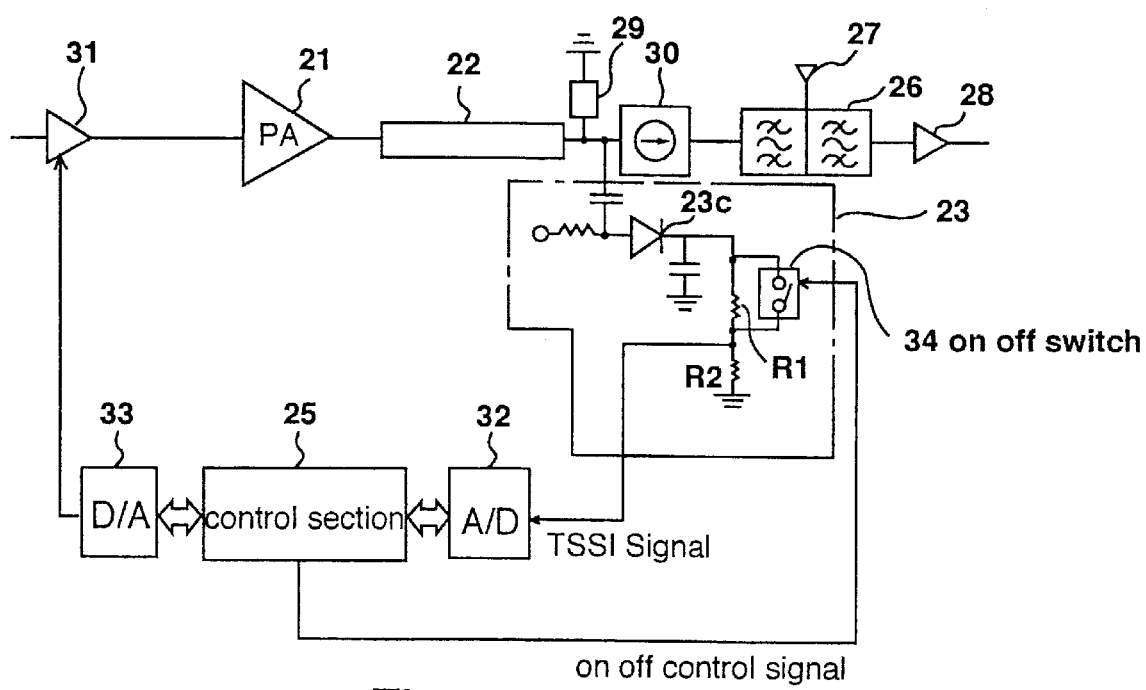
FIG. 7 is a block diagram showing the configuration of a fourth embodiment.

Next, a fourth embodiment of an output power control device of the present invention will be described with reference to FIG. 7. In the construction of FIG. 7, parts that are the same as in FIG. 6 have the same reference numerals.

In this fourth embodiment, an ON/OFF switch 34 is provided in parallel with one of the dividing resistors R1. An ON/OFF control signal from the control section 25 is supplied to this ON/OFF switch 34. When the ON/OFF switch 34 is on (closed), the load resistance is R2 only, because the resistor R1 is short circuited, and the detection voltage is output as the TSSI signal without being potentially-divided by resistors R1 and R2. On the other hand, when the ON/OFF switch 34 is off (open), the detection voltage is potentially-divided by the resistors R1 and R2 and output as the TSSI signal. The control section 25 outputs an on/off control signal to cause the ON/OFF switch 34 to be turned off when the target output power level is large, and outputs an on/off control signal to cause the ON/OFF switch 34 to be turned on when the target output power level is small. Also, the control section 25 alters extraction of the TSSI signal data from the A/D converter 32 depending on the instruction content of the on/off control signal. For example, if resistors R1 and R2 have the same resistance value, there is a doubling relationship even if the TSSI signal data when the ON/OFF switch 34 is on and the TSSI signal data when the ON/OFF switch 34 is off are the same data value, and the control section 25 prepares FB signal data taking this point into consideration. For example, as the voltage at the cathode side of the detection diode 23c, a voltage of 10V is obtained at the point of maximum output power PL2 of the North American digital cellular system (class 3), while a voltage of 250 mV is obtained at the point of minimum output power level PL10, and the voltage dividing ratio of the load resistance 23e comprising the two serially connected resistors R1 and R2 is made ½. When the point of maximum output power PL2 is the target output power level, the ON/OFF switch 34 is caused to be off, and a TSSI signal having a potentially divided voltage of 5V is input to the A/D converter 32. In this way, the A/D converter 32 can be made to function effectively even when the detection voltage is larger than the maximum voltage obtained through processing of the A/D converter 32 (e.g. 5V). On the other hand, when the point of minimum output power PL10 is the target output power level, the ON/OFF switch 34 is caused to be on, and a TSSI signal which is actually the 250 mV detection voltage is input to the A/D converter 32. In this way, it is possible to raise the resolution of the TSSI signal data from the A/D converter 32 to a higher level than that in the third embodiment. As a result, according to this fourth embodiment, in addition to the effects of the previous embodiments, power control can be carried out in a power control range extending outside the convertible range of the A/D converter 32, and also, in a range where the output power level is small, power control can be carried out in finer steps.

Figure 8:
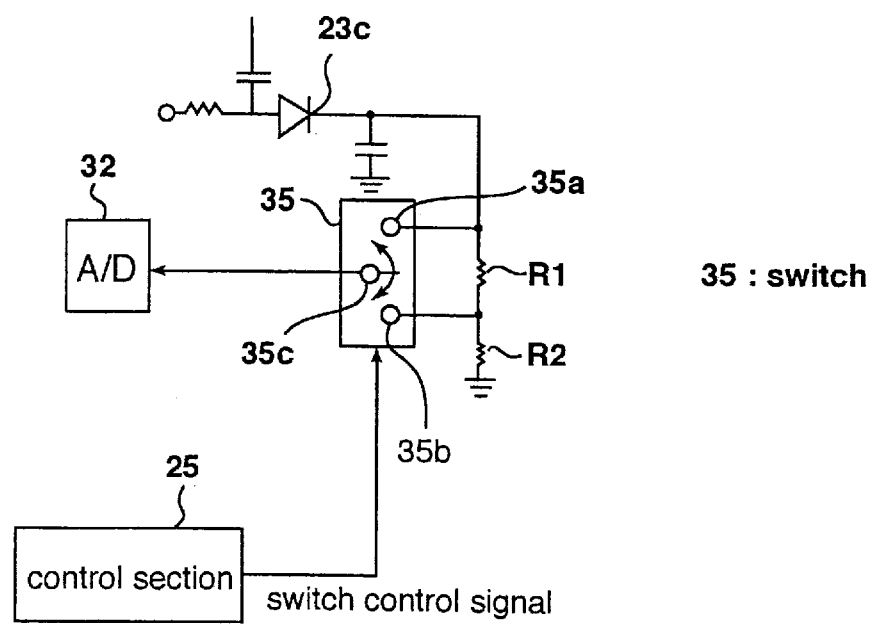
FIG. 8 is a block diagram showing the configuration of a fifth embodiment.

Next, a fifth embodiment of a output power control device of the present invention will be described with reference to FIG. 8. In the construction of FIG. 8, parts that are the same as in FIG. 7 have the same reference numerals.

This fifth embodiment has the same technological concept as the fourth embodiment. The fifth embodiment is different from the fourth embodiment in that instead of the switch 34 in the fourth embodiment, a switch 35 is provided for switching between direct output of the detection voltage obtained at the cathode side of the detection diode 23c or output via a potential divider. That is, a 2-input 1-output switch 35 having a so-called c connection point construction is used, with one input terminal 35a of the switch 35 being connected to a point of connection between the cathode of the detection diode 23c and the resistor R1, with the other input terminal 35b of the switch 35 being connected to a point of connection between the two resistors R1 and R2. The control section 25 outputs a switch control signal to cause the switch 35 to connect to the input terminal 35b when the target output power level is large, and to cause the switch 35 to connect to the input terminal 35a when the target output power is small. Other points are the same as in the fourth embodiment, and similar effect to those in the fourth embodiment are also obtainable in the fifth embodiment. In the fourth embodiment and the fifth embodiment, it has been shown how the potential dividing ratio is switched in two steps, but naturally it is also possible to switch the potential dividing ratio in 3 or more steps.

Figure 9:
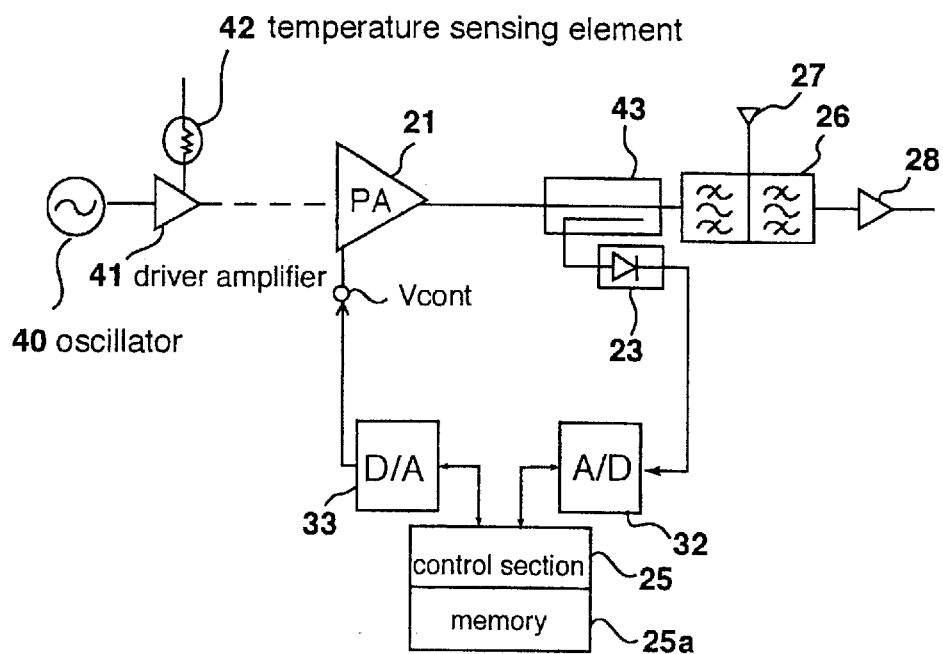
FIG. 9 is a block diagram showing the configuration of a sixth embodiment.

Next, a sixth embodiment of an output power control device of the present invention will be described with reference to FIG. 9. In the construction of FIG. 9, parts that are the same as in FIG. 6 have the same reference numerals.

In the remaining embodiments, from this sixth embodiment to the final tenth embodiment, the method of extracting the signal for output power control from the basic route of the transmission signal will be described assuming it to be the same as in the related art, but because this extraction method is not a feature of the present invention, it is naturally possible to also apply the extraction methods used in the already described first to fifth embodiments. In the descriptions of the sixth and later embodiments, the target output power level is classified into two size ranges, and different output power control is carried out for each of the respective cases. The range where the target output power level is large means a range where the detection signal level is large corresponding to that target output power level, and feedback control is not affected even when being subjected to the influence of temperature variations. On the contrary, the range when the target output power level is small means a range where the detection signal level is small corresponding to that target output power level and feedback control is greatly affected when being subjected to the influence of temperature variations. In other words, it refers to a range where accurate feedback control is not carried out even when the detection signal is detected.

Features of this sixth embodiment are that a temperature sensing element 42, such a thermistor, is connected to a drive amp 41 for amplifying and driving a carrier signal from an oscillator 40, and that the control section 25 forms FB signal data (control data) by taking in TSSI signal data from the A/D converter 32 when the target output power is large, but forms the control data without taking in TSSI signal data from the A/D converter 32 when the target output power is small. The control section 25 stores fixed data to be used when the target output power level is small in a built-in memory 25a. FIG. 9 shows the temperature sensing element 42 being connected to the power supply terminal of the drive amp 41, but the temperature sensing element can also be connected so as to control the gain of the drive amp 41, and this connection terminal is not limited to the power supply terminal. Here, the temperature sensing element 42 has been provided so as to enable temperature compensation for the gain of the drive amp 41. The temperature characteristic of the temperature sensing element 42 is not determined considering only the gain of the drive amp 41, but is selected to be a temperature characteristic that can provide temperature compensation of the gain of the drive amp 41 so as to be able to cancel out overall linear gain temperature variations caused by all of the circuits in the route from the oscillator 40 to the antenna coupler 26 (for example, radio frequency band filters, amplifiers, frequency converters).

In this way, by carrying out temperature compensation for linear gain in the radio frequency band, the output power appearing at the edge of the antenna 27 when the control voltage of the power control terminal Vcont of the power amplifier 21 has been fixed can be stabilized considerably, even when the temperature has changed. For example, it depends on the number of blocks (circuits) constituting the transmission system, but by using the above described simple temperature compensation, it is possible to keep the gain variation down to ±2 dB with a variation in temperature in the range −30° C.−+85° C.

Next, the output power control operation of the output power control device of the sixth embodiment will be described. When the target output power is large, the voltage detection resolution of the A/D converter 32 is sufficiently good, so the control section 25 forms the FB signal data by extracting TSSI signal data from the A/D converter 32 and carrying out a feedback operation, and outputs to the D/A converter 33. When the target output power is small, the voltage detection resolution of the A/D converter 32 becomes large, and problems arise for the same reasons as in the background art. In the sixth embodiment, when the target output power is small, the control section 25 does not extract TSSI signal data from the A/D converter 32, but reads control data corresponding to the target power level at that time from the memory 25a and outputs this data to the D/A converter 33, and causes a fixed control signal to be applied to the power control terminal Vcont of the power amplifier 21. The fixed control data is preferably obtained during manufacture, by detecting data values for obtaining desired output powers and storing these data values. Accordingly, when the target output power level is small, the open control mentioned above is used and not feedback loop control, but the linear gain of the overall transmission system is temperature compensated by the temperature sensing element 42, as mentioned above, and so problems such as temperature variation of the detection resolution and detection voltage of the A/D converter 32 do not arise. As has been described above, according to the sixth embodiment, it is possible to carry out good temperature compensation and fine output power control over a wide output power range.

Figure 10:
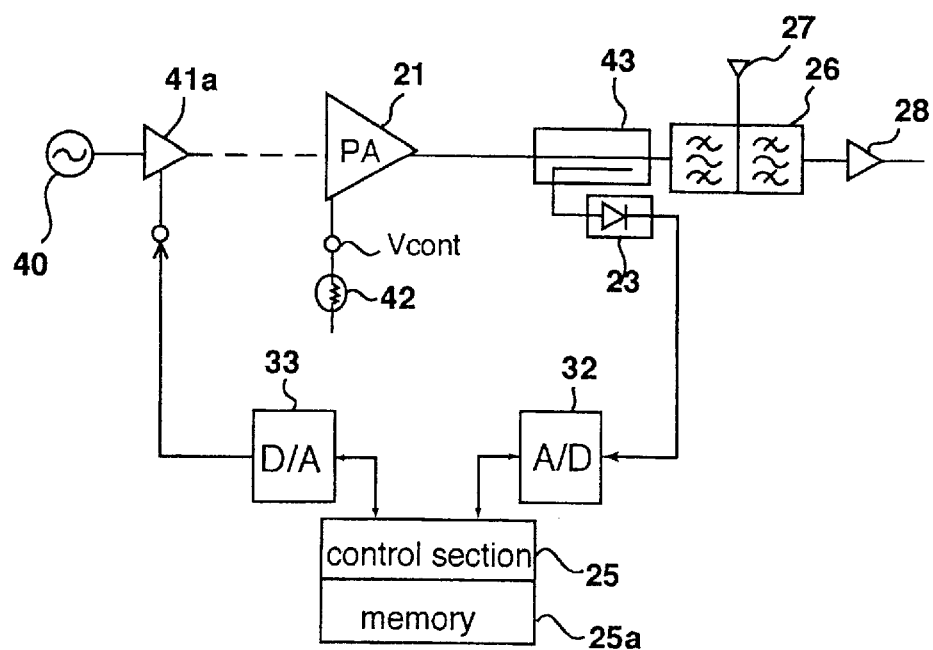
FIG. 10 is a block diagram showing the configuration of a seventh embodiment.

Next, a seventh embodiment of an output power control device of the present invention will be described with reference to FIG. 10. In the construction of FIG. 10, parts that are the same as in FIG. 9 have the same reference numerals.

This seventh embodiment has the same technological concept as the sixth embodiment. That is, control is switched between feedback control and open control depending on the target output power level, and temperature compensation of the transmission is carried out using a temperature sensing element 42. Differences from the sixth embodiment are that the temperature sensing element 42 is connected to the power amplifier 21, and that the feedback destination of the control signal (point of application) is the variable gain amplifier (for example, drive amp) 41 a upstream of the power amplifier 21. These differences exist, but the same operation and effects as in the sixth embodiment can also be obtained by the seventh embodiment.

Figure 11:
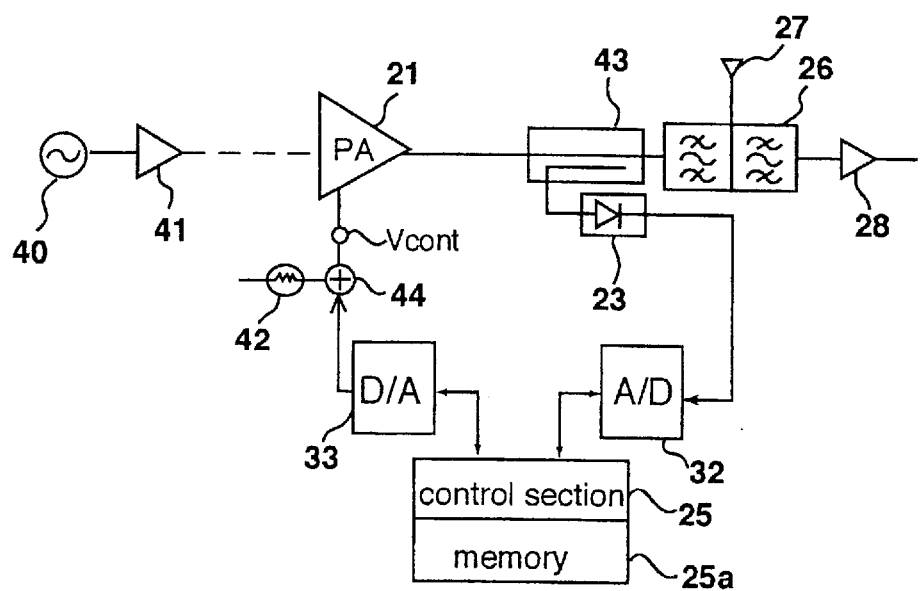
FIG. 11 is a block diagram showing the configuration of a eighth embodiment.

Next, an eighth embodiment of an output power control device of the present invention will be described with reference to FIG. 11. In the construction of FIG. 11, parts that are the same as in FIG. 9 have the same reference numerals.

This eight embodiment also has the same technological concept as the sixth embodiment. Differences from the sixth embodiment are that a control voltage signal from the temperature sensing element 42 and a FB signal from the D/A converter 33 are superimposed by a combining section 44, and are applied to the power control terminal Vcont of the power amplifier 21. These differences exist, but the eighth embodiment can obtain the same operation and effects as the sixth embodiment. The fact that the point of connection of the temperature sensing element 42 for temperature compensation is arbitrary has been described using the sixth to eighth embodiments, but it is also possible for filters or mixers, etc. omitted from the drawings to be the point of connection of the temperature sensing element 42.

Figure 12:
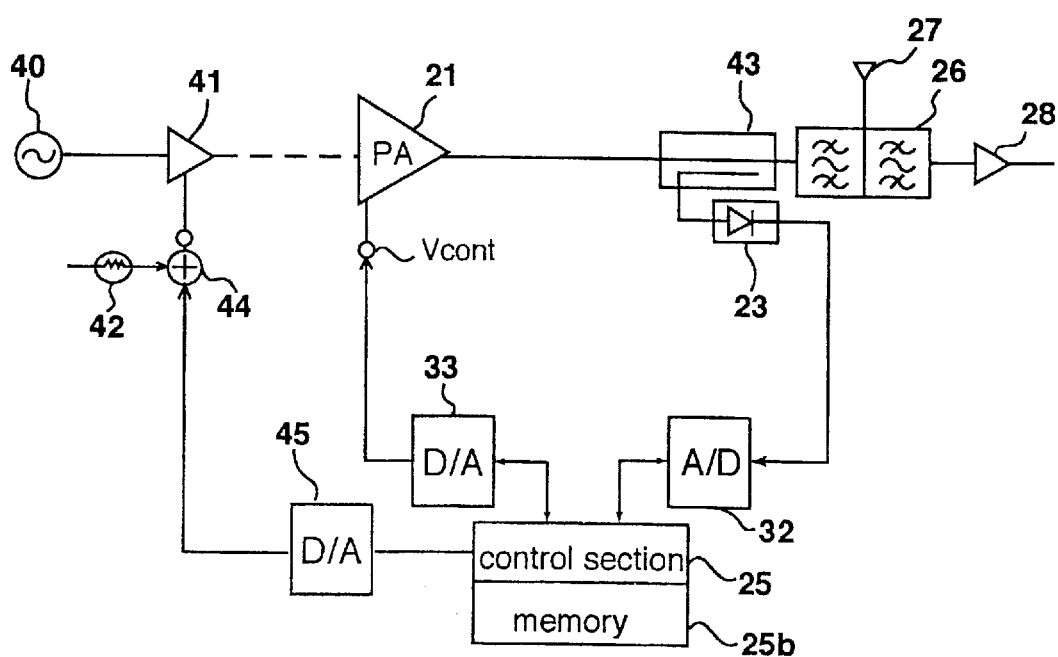
FIG. 12 is a block diagram showing the configuration of a ninth embodiment.

Next, a ninth embodiment of an output power control device of the present invention will be described with reference to FIG. 12. In the construction of FIG. 12, parts that are the same as in FIG. 11 have the same reference numerals.

In this ninth embodiment there are two amplifiers to which the control voltage signal for controlling the output power is applied. That is, the control voltage signal is applied to the drive amp 41 and the power amplifier 21. Similarly to the previously described embodiments, a first control voltage signal to the power amplifier 21 is applied to the power control terminal Vcont of the power amplifier 21. Here, a second control voltage signal from a D/A converter 45 is superimposed on a control signal from the temperature sensing element 42 by the combining section 44, and the combined signal is applied to a control terminal of the drive amp 41. When the target output power level is large, the control section 25 of this ninth embodiment forms FB signal data by taking in TSSI signal data from the A/D converter 32. The control section 25 supplies the TSSI signal data to D/A converter 33 and applies a first control voltage signal to the power amplifier 21. Further, when the target output power level is small, the control section 25 does not extract TSSI signal data from the A/D converter 32, but extracts fixed first and second control voltage signal data corresponding to the target output power level at that time from the built-in memory 25b, supplies the first control voltage signal to the D/A converter 33 and supplies the second control voltage signal to the D/A converter 45. The first control voltage signal data has fixed values absolutely set according to the target output power level, while the second control voltage signal data are obtained when the device is manufactured, for example, by detecting data values for achieving desired output power, and storing these values in the memory 25b.

Next, the control operation of the ninth embodiment of the output power control device will be described. When the target output power is large, the voltage detection resolution of the A/D converter 32 is sufficiently small, so the control section 25 forms FB signal data by taking in TSSI signal data from the A/D converter 32, carrying out a feedback computation and outputting it to the D/A converter 33. The control section 25 causes a first control voltage signal to be applied to the power amplifier 21. Namely, in this case, ordinary feedback control is carried out. At this time, data is not output from the control section 25 to the D/A converter 45, but the control voltage signal from the temperature sensing element 42 is applied to the control terminal of the drive amp 41 via the combining section 44, and, not only temperature compensation using the feedback loop, but also temperature compensation utilizing the temperature sensing element 42 is carried out. When the target output power is small, the control section 25 does not take in TSSI data from the A/D converter 32, but reads out fixed first and second control signal data corresponding to the target output power level at that time from the memory 25b, and supplies the first control voltage signal data to the D/A converter 33 and the second control voltage signal to the D/A converter 45. Namely, similarly to the sixth to eighth embodiments, the ninth embodiment also uses open control when the target output power is small. Accordingly, in the ninth embodiment also, control is switched between feedback control and open control according to the target output power, and because temperature compensation is carried out using the temperature sensing element 42, problems such as the resolution of the A/D converter and temperature variation can be avoided, and it is possible to carry out good temperature compensation and fine stabilized output power control over a wide output power range. According to this ninth embodiment, the gain control section at the time of open control is split into two systems, which means that the effect of stabilizing the overall gain characteristic is also achieved, even at the time of open control.

For example, if control of a gain in excess of 40 dB is carried out by a gain control section of one system, this gain control system must obtain sufficient gain, and further, sufficient isolation must also be realized. However, if sufficient gain and isolation are realized in a frequency band exceeding 100 MHz, there is a fear of oscillation etc. occurring, and a problem of stability. Further, the sensitivity of the gain variation for a control voltage is not high, which means that differences in such things as the temperature characteristic of the gain control section itself, or the amount of variation, become large. Because of this, even when temperature compensation is carried out using the temperature sensing element 42, the effect of temperature compensation is inhibited because of differences in the amount of temperature variation. Further, in the case of linearization, there is a problem that a gain range arises in which the distortion level is not maintained at a desired level with the gain control section of one system. In the gain control section of two systems, by causing the gain control to be shared, these problems can be alleviated, and the overall gain control characteristic can be made stable.

Figure 13:
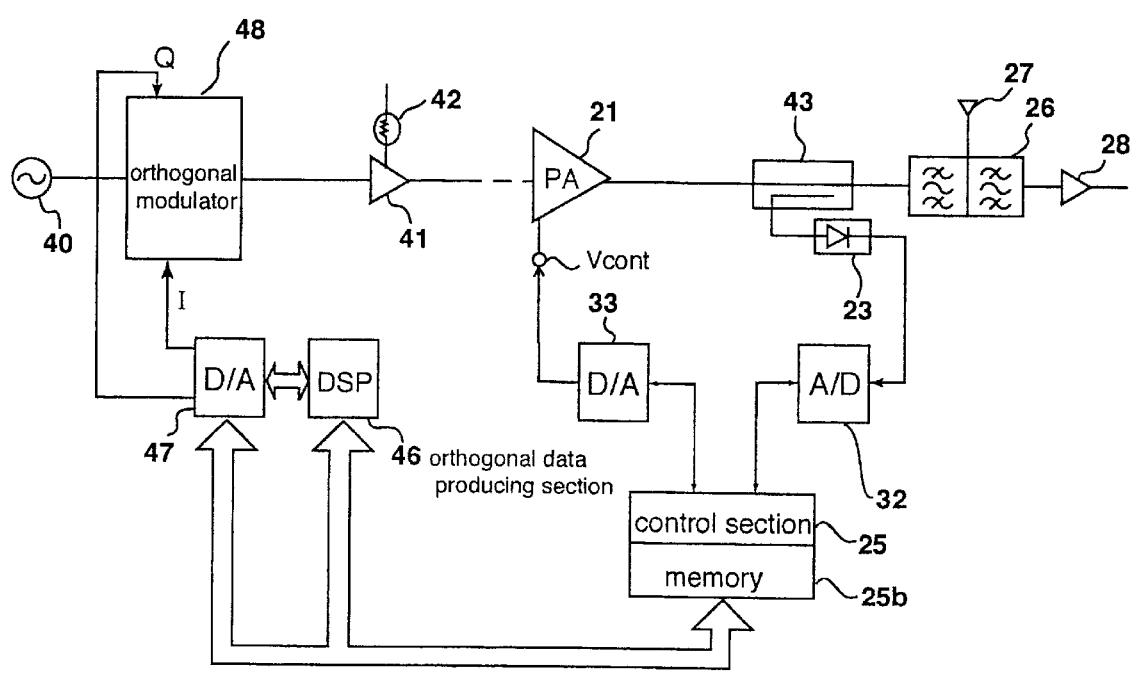
FIG. 13 is a block diagram showing the configuration of a tenth embodiment.

Next, a tenth embodiment of an output power control device of the present invention will be described with reference to FIG. 13. In the construction of FIG. 13, parts that are the same as in FIG. 12 have the same reference numerals.

This tenth embodiment has the same technological concepts as the ninth embodiment. That is, control is alternated between feedback control and open control depending on the target output power level, temperature compensation is carried out using a temperature sensing element 42, and the gain control when open control is being used is shared between two systems. In this tenth embodiment a circuit portion constituting one of the two gain control sections of the two systems functioning when open control is used is different from embodiment 9. In FIG. 13, an orthogonal data preparing section (DSP) 46 comprises, for example, a DSP (digital signal processor) and forms I data and Q data from source data to be transmitted, under the control of the control section 25. Also, a D/A converter 47 forms an I baseband signal and a Q baseband signal by respectively digital/analog converting the I data and the Q data from the orthogonal data preparing section 46 under the control of the control section 25, and inputs these two baseband signals to an orthogonal modulator 48. The orthogonal modulator 48 orthogonally modulates a carrier signal from a sender 40, based on the I baseband signal and the Q baseband signal, and outputs the result to a drive amp 41. This type of orthogonal modulator construction is widely used in radios of digital systems. When carrying out open control, the control section 25 of this tenth embodiment supplies second control signal voltage data stored in the built-in memory 25*b* to the orthogonal data preparing section 46 and the D/A converter 47, and causes the amplitude of the I base band signal and the Q baseband signal from the D/A converter 47 to be varied in response to the target output power level. Here, the orthogonal modulator 48 is an AM linear modulator, so the output power from the orthogonal modulator 48 is proportional to the amplitude of the I baseband signal and the Q baseband signal. Accordingly, the above described orthogonal modulator comprises one of the other gain control sections.

Next, the output power control operation of the tenth embodiment will be described. When the target output power is large, the control section 25 takes in TSSI signal data from the A/D converter 32, carries out feedback computation to form an FB signal, outputs it to the D/A converter 33. The control section 25 causes a first control voltage signal to be applied to the power amplifier 21. That is, ordinary feedback control is carried out in this case. In this case, the control section 25 controls the amplitude of the I baseband signal and the Q baseband signal from the D/A converter 47 so as to allow the extraction of the maximum amplitude that will result in the modulation signal from the orthogonal modulator 48 being linear. On the other hand, when the target output power is small, the control section 25 does not take in TSSI signal data from the A/D converter 32, but reads out first and second control voltage signal data fixed according to the target output power level at that time from the memory 25*b,* and supplies the first control voltage signal data to the D/A converter 33 and supplies the second control voltage signal data to the orthogonal data preparing section 46. In this way, the amplitude of the I baseband signal and the Q baseband signal from the D/A converter 47 is varied. That is, in this tenth embodiment, similarly to the sixth to ninth embodiments, open control is used when the target output power is small.

The tenth embodiment can also realize the same effects as the ninth embodiment. Additionally, the following effects can also be obtained. Because the amplitude of the I baseband signal and the Q baseband signal from the D/A converter 47 are varied as a result of arithmetic processing of the orthogonal data preparation section comprising the DSP, it is generally possible to carry out precise amplitude fixing, and the amplitude can be controlled up to a level at which waveform distortion becomes a problem. Usually, in the case of control for small output power, the distance between a mobile terminal and a base station is small, and a sufficient C/N ratio can be ensured at the base station receiver side. However, even if the quality of a baseband signal (waveform distortion rate, etc.) is taken into consideration, amplitude control in steps of 8–12 dB is made practically possible. Amplitude control can be carried out well, which means that it is also possible to carry out gain control well. Further, the orthogonal data preparing section 46, D/A converter 47 and orthogonal modulator 48 functioning as the second gain control section are not related to gain control and are provided in a radio even if gain control is not carried out. In other words, the existing construction is also used for gain control. Therefore, differing from the ninth embodiment, it is possible to eliminate the need for a new construction.

In the above sixth to tenth embodiments, the control configuration has been shown as using a digital processing construction, but the utilization of alternate feedback control and open control, or the carrying out of temperature compensation using a temperature sensing element 42, etc., can also be applied to an output power control device using control with an analog construction. Each of the above embodiments has been described on the assumption that the output power control device of the present invention is housed in a mobile terminal conforming to the digital cellular system or the Analog Cellular System, but the type of radio into which the output control device of the present invention can be installed is not restricted to such a system. For example, it can be provided on the base station side. Further, it is also applicable to radios for communication systems other than car phone systems or portable phone systems.

As has been explained up to now, according to the present invention, an output power control device is provided that can carry out output power control within a temperature compensation range.

This output power control device is obviously effective when applied to a mobile radio or a base station in a digital cellular system or Analog Cellular System, but it is also effective when applied to a mobile radio or base station in any communication system requiring output power control.

We claim:

1. An output power control device that switches transmission output power gradually or continuously, comprising:

a feedback control system for feedback controlling the output power;

an open control system for open controlling the output power;

control system switching means for causing the feedback control system to function when a target output power level is larger than a previously set fixed value, and for causing the open control system to function when a target output power level is smaller than a previously set fixed value; and temperature compensation means for compensating for temperature variation at least when the open control system is functioning.

2. An output control device according to claim 1, wherein the feedback control system comprises:

a detection circuit for detecting the output power;

an analog/digital converter for analog/digital converting a detection signal from the detection circuit;

a control section for forming feedback data based on detection data from the analog/digital converter;

a digital/analog converter for digital/analog converting control data from the control section; and variable gain means for causing an output level to vary in response to a control signal from the digital/analog converter, and the open control system comprises:

the control section;

the digital/analog converter; and the variable gain means, wherein said control system switching means comprises the control section.

3. An output control device according to claim 2, further comprising a second digital/analog converter for digital/analog converting second control data from the control section, and second variable gain means for causing an output level to vary in response to a second control signal from the second digital/analog converter, wherein when the feedback control system is functioning, the control section is operable for providing control data to the digital/analog converter in response to the detection data, while when the open control system is functioning, the control section is operable for supplying control data, fixedly determined according to the target output power, to the digital/analog converter, and for supplying second control data, fixedly determined according to the target output power, to the second digital/analog converter.

4. An output control device according to claim 2, further comprising orthogonal signal forming means for forming a Q baseband signal and an I baseband signal in response to transmission information, and an orthogonal modulator for orthogonally modulating a carrier wave in response to the I baseband signal and the Q baseband signal, wherein when the feedback control system is functioning, the control section is operable for providing control data to the digital/analog converter in response to the detection data, while when the open control system is functioning, the control section is operable for supplying control data, fixedly determined according to the target output power, to the digital analog converter, and for controlling the amplitude of the I baseband signal and the Q baseband signal from the orthogonal signal forming means to amplitudes fixedly determined according to the target output power.

* * * * *